United States Patent
Yamaguchi

(10) Patent No.: US 11,929,306 B2
(45) Date of Patent: Mar. 12, 2024

(54) SEMICONDUCTOR DEVICE COMPRISING FIRST AND SECOND LEAD FRAMES

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kakeru Yamaguchi, Yokohama (JP)

(73) Assignees: KABUSHIKI KAISHA TOSHIBA, Tokyo (JP); TOSHIBA ELECTRONIC DEVICES & STORAGE CORPORATION, Tokyo (JP)

(*) Notice: Subject to any disclaimer, the term of this patent is extended or adjusted under 35 U.S.C. 154(b) by 100 days.

(21) Appl. No.: 17/552,148

(22) Filed: Dec. 15, 2021

(65) Prior Publication Data

US 2022/0301986 A1     Sep. 22, 2022

(30) Foreign Application Priority Data

Mar. 22, 2021 (JP) .................................. 2021-047248

(51) Int. Cl.
H01L 23/495 (2006.01)
(52) U.S. Cl.
CPC .. H01L 23/49513 (2013.01); H01L 23/49544 (2013.01); H01L 23/49555 (2013.01)
(58) Field of Classification Search
CPC .............................................. H01L 23/49513
USPC ........................................................ 257/666
See application file for complete search history.

(56) References Cited

U.S. PATENT DOCUMENTS

| | | | |
|---|---|---|---|
| 9,275,921 B2 | 3/2016 | Miyakawa | |
| 2014/0220744 A1* | 8/2014 | Damberg | H01L 21/4853 438/127 |
| 2015/0221582 A1 | 8/2015 | Miyakawa | |
| 2020/0227279 A1* | 7/2020 | Umeda | H01L 24/84 |

FOREIGN PATENT DOCUMENTS

| | | |
|---|---|---|
| EP | 3 483 931 A1 | 5/2019 |
| EP | 3 503 179 A1 | 6/2019 |
| JP | 1-102996 A | 4/1989 |
| JP | 3-120049 U | 12/1991 |
| JP | 6-26280 U | 4/1994 |
| JP | 2008-258649 A | 10/2008 |
| JP | 2012-104708 A | 5/2012 |
| JP | 2015-142072 A | 8/2015 |
| KR | 10-2016-0033869 A | 3/2016 |

* cited by examiner

*Primary Examiner* — Ajay Arora
(74) *Attorney, Agent, or Firm* — Oblon, McClelland, Maier & Neustadt, L.L.P.

(57) ABSTRACT

A semiconductor device of an embodiment includes a first lead frame, a second lead frame located apart from the first lead frame, a semiconductor chip mounted on the first lead frame, and a conductive member. The conductive member electrically connects an electrode of the semiconductor chip to the second lead frame through a conductive adhesive. The conductive member includes a cut face located apart from a bonding face of the electrode, on which the conductive member is bonded.

10 Claims, 7 Drawing Sheets

SEMICONDUCTOR DEVICE COMPRISING FIRST AND SECOND LEAD FRAMES

CROSS-REFERENCE TO RELATED APPLICATIONS

This application is based upon and claims the benefit of priority from Japanese Patent Application No. 2021-047248, filed on Mar. 22, 2021, the entire contents of which are incorporated herein by reference.

FIELD

Embodiments described herein relate generally to a semiconductor device.

BACKGROUND

There is a known semiconductor device in which a lead frame and an electrode of a semiconductor chip are electrically connected by, for example, a plate-shaped connector. Mechanical and electrical connection is made by conductive adhesives, such as solder, between the electrode and the connector, and between the lead frame and the connector.

A reflow furnace is used in a bonding process for a semiconductor package manufactured by bonding a silicon (Si) chip to a lead frame and a copper (Cu) connector with lead solder and sealing them by molding.

There is a problem that a copper connector with poor solder wettability during a reflow process causes a defective joint, resulting in a defective product in terms of solder joint reliability.

DETAILED DESCRIPTION

A semiconductor device of an embodiment includes a first lead frame, a second lead frame located apart from the first lead frame, a semiconductor chip mounted on the first lead frame, and a conductive member. The conductive member electrically connects an electrode of the semiconductor chip to the second lead frame through a conductive adhesive. The conductive member includes a cut face located apart from a bonding face of the electrode, on which the conductive member is bonded.

The following describes the embodiment with reference to the drawings. In the present specification, components according to the embodiment and descriptions of the components may be described in a plural form. The components and their descriptions are examples and are not limited by the expressions in the present specification. The components may be identified by names different from those in the present specification. The components may also be described by different expressions than those in the present specification.

Figure 1:
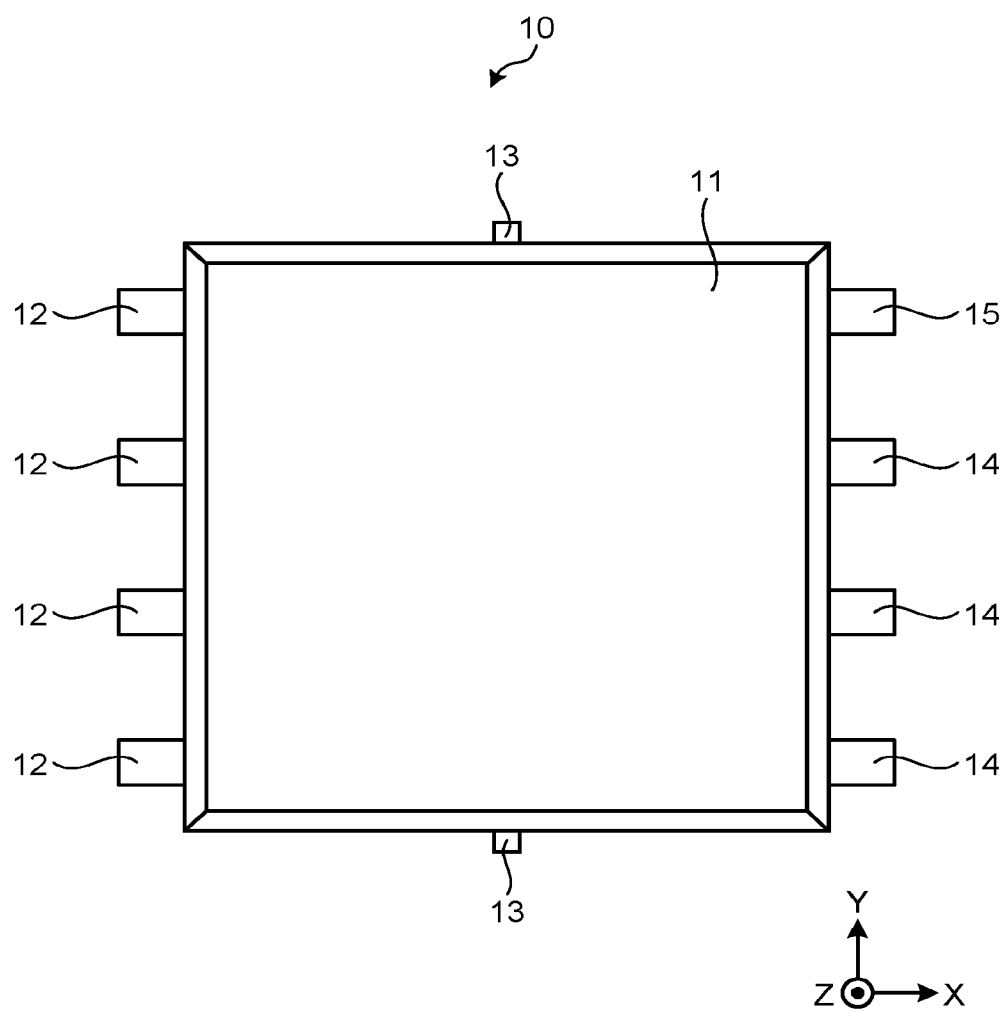
FIG. 1 is an external front view of the semiconductor device of an embodiment.
Figure 2:
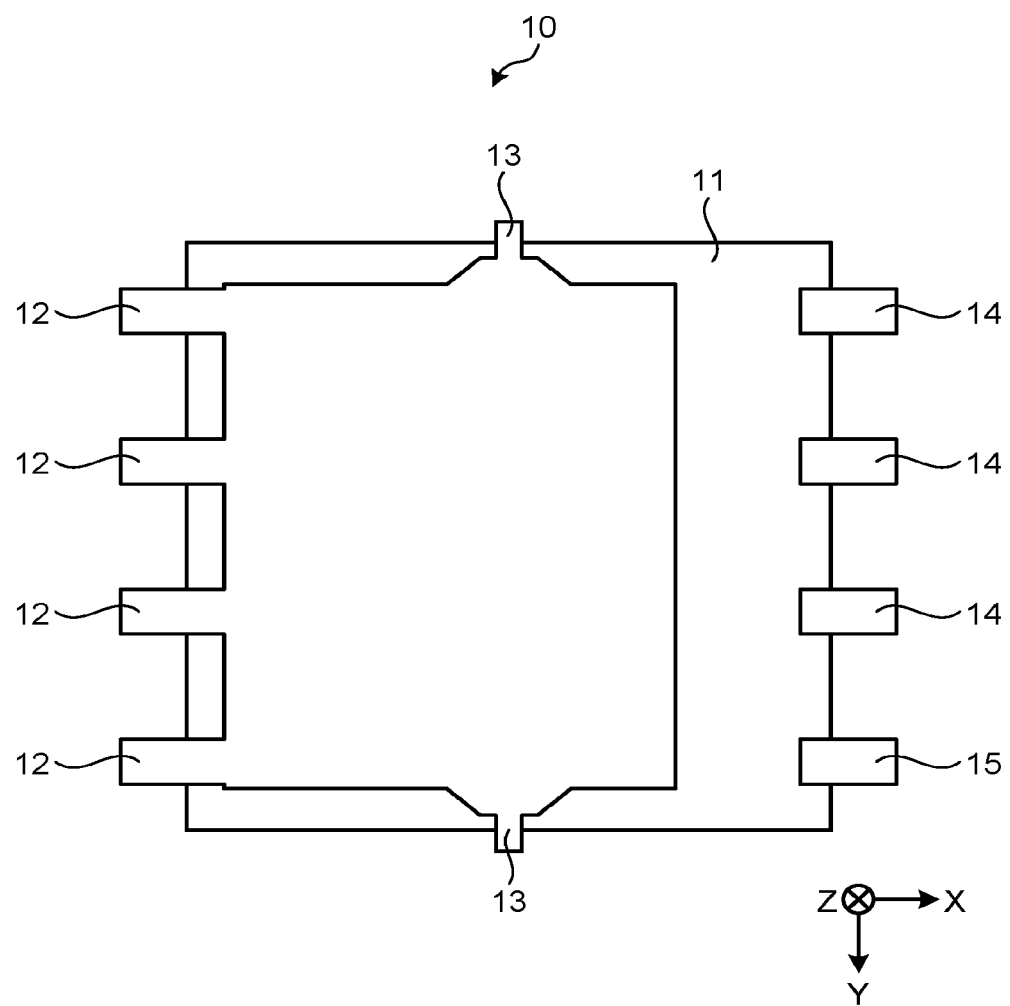
FIG. 2 is an external rear view of the semiconductor device of the embodiment.
Figure 3:
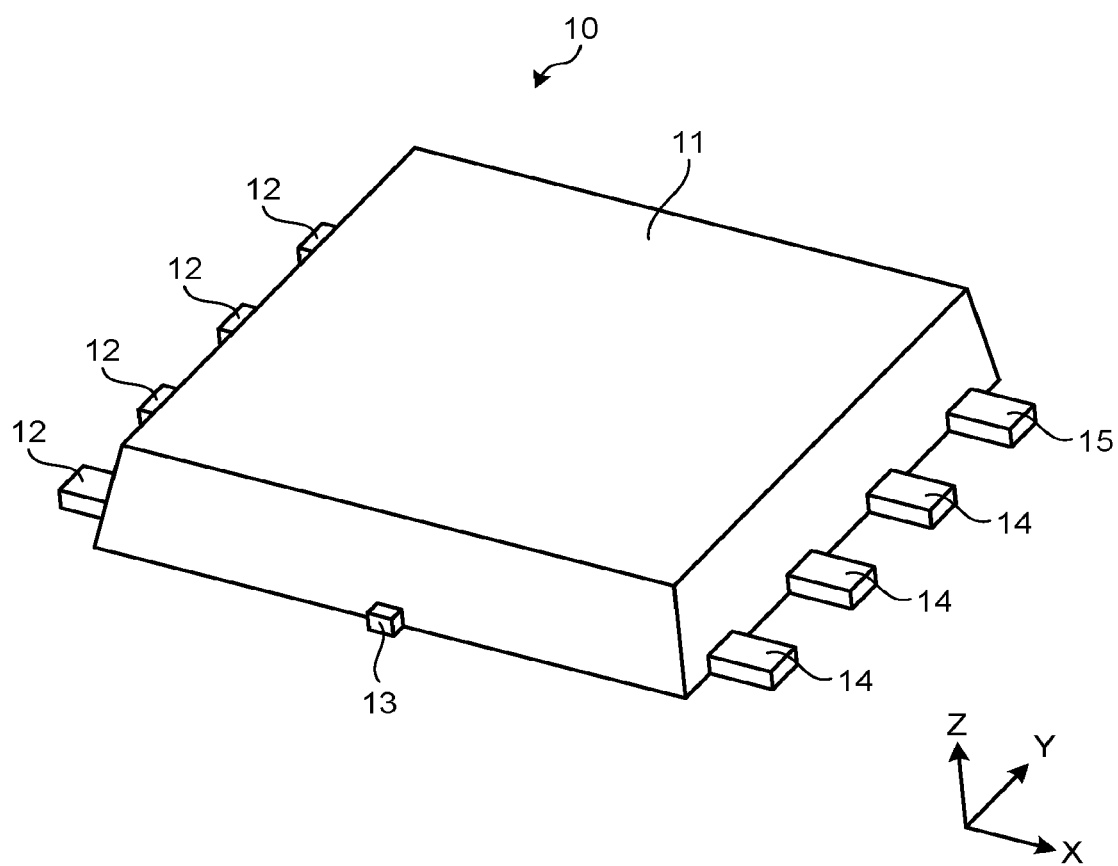
FIG. 3 is an external perspective view of the semiconductor device of the embodiment.

FIG. 1 is an external front view of the semiconductor device of the embodiment. FIG. 2 is an external rear view of the semiconductor device of the embodiment. FIG. 3 is an external perspective view of the semiconductor device of the embodiment. A semiconductor device 10 is configured as a power device (power transistor), for example. The semiconductor device 10 is not limited to this example, and may be any other device.

As illustrated in each of the drawings, an X-axis, a Y-axis, and a Z-axis are defined in the present specification for convenience. The X-axis, Y-axis, and Z-axis are orthogonal one another. The X axis is provided along a width of the semiconductor device 10. The Y axis is provided along a length (depth) of the semiconductor device 10. The Z-axis is provided along a thickness of the semiconductor device 10.

Moreover, an X direction, a Y direction, and a Z direction are defined in the present specification. The X direction is a direction along the X-axis, and includes a +X direction indicated by an arrow of the X-axis and a −X direction being the opposite direction of the arrow of the X-axis. The Y direction is a direction along the Y-axis, and includes a +Y direction indicated by an arrow of the Y-axis and a −Y direction being the opposite direction of the arrow of the Y-axis. The Z direction is a direction along the Z-axis, and includes a +Z direction indicated by an arrow of the Z-axis and a −Z direction being the opposite direction of the arrow of the Z-axis.

As illustrated in FIG. 1, the semiconductor device 10 includes a resin mold 11, first connectors 12, second connectors 13, third connectors 14, and a fourth connector 15. In this configuration, the first connectors 12 and the second connectors 13 constitute part of a first lead frame. The third connectors 14 function as a third lead frame, and the fourth connector 15 function as a second lead frame. The first connectors 12 (four in an example of FIG. 1) are provided to each extend in the −X direction from the resin mold 11. The second connectors 13 are provided such that one of them extends in the +Y direction and the other extends in the −Y direction from the resin mold 11. The third connectors 14 (three in the example of FIG. 1) are provided to each extend in the +X direction from the resin mold 11. The fourth connector 15 is provided to extend in the +X direction from the resin mold 11.

The first connectors 12 and the second connectors 13 function as a lead frame, as described above, and are exposed from the resin mold 11 as illustrated in FIG. 2 for heat dissipation of the semiconductor chips, which will be described later.

The resin mold 11 seals parts of the first connectors 12 to the fourth connector 15, the semiconductor chip, part of the first lead frame, the second lead frame, and a third lead frame, which will be described below.

Figure 4:
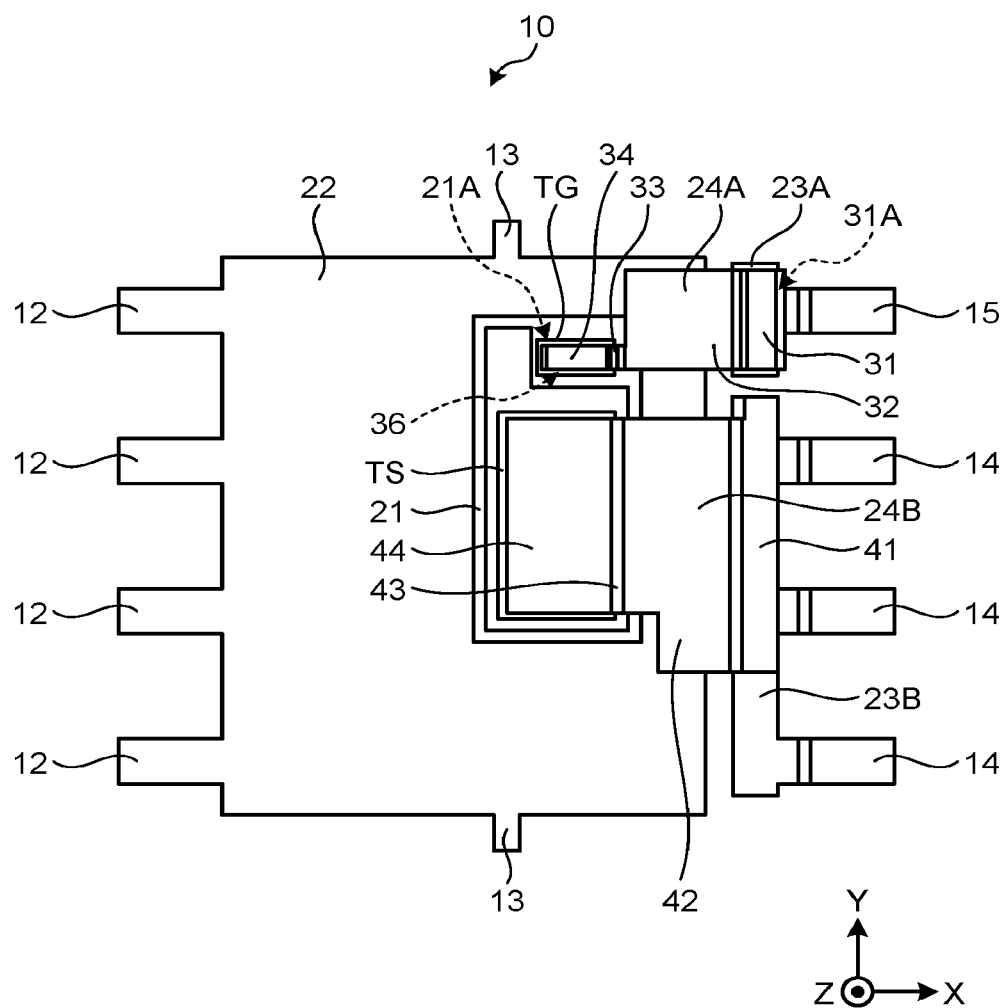
FIG. 4 is a front view of the semiconductor device of the embodiment before molding.

FIG. 4 is a front view of the semiconductor device of the embodiment before molding. The semiconductor device 10 includes a first lead frame 22 on which a semiconductor chip 21 is mounted.

The semiconductor chip 21 is a vertical device such as a vertical metal-oxide-semiconductor field effect transistor (MOSFET). The semiconductor chip 10 is not limited to this example, but may be a vertical insulated gate bipolar transistor (IGBT), a vertical diode, or any other desired semiconductor chip.

The semiconductor chip 21 contains silicon (Si) as a semiconductor. The semiconductor chip 21 is not limited to this example, but may also include a compound semiconductor that is different from silicon, such as SiC or GaN.

In this case, a gate terminal TG and a source terminal TS are provided on the front side (a side located in the +Z direction) of the semiconductor chip 21. The gate terminal TG does not carry current, so that the gate terminal TG is provided to have a smaller area than the source terminal TS.

In the present embodiment, the gate terminal TG has a rectangular shape in plan view and is disposed along the X-axis.

A drain terminal, which is not illustrated, is provided on the rear side of the semiconductor chip 21 (a face located in the −Z direction). The drain terminal of the semiconductor chip 21 is electrically connected to the first lead frame 22 with lead solder serving as a conductive adhesive. As a result, the semiconductor chip 21 is mechanically fixed to the first lead frame 22 and thereby becomes a predetermined thermal conducting state. This enables the semiconductor chip 21 to dissipate the heat thereof through the first lead frame 22.

The three ends of the first lead frame 22 (a left end, a top end, and a bottom end in an example of FIG. 4) constitute the first and second connectors 12 and 13, which function as drain terminals TD. One end of a second lead frame 23A constitutes the fourth connector 15 functioning as the gate terminal TG. One end of a third lead frame 23B constitutes the third connectors 14 functioning as the source terminal TS.

A metal (Cu) connector 24A, which functions as a conductive member, is mechanically and electrically connected to between the gate terminal TG of the semiconductor chip 21 and the second lead frame 23A with lead solder serving as a conductive adhesive.

Similarly, a metal (Cu) connector 24B, which functions as a conductive member, is mechanically and electrically connected to between the source terminal TS of the semiconductor chip 21 and the 32nd lead frame 23 with lead solder serving as a conductive adhesive.

Figure 5:
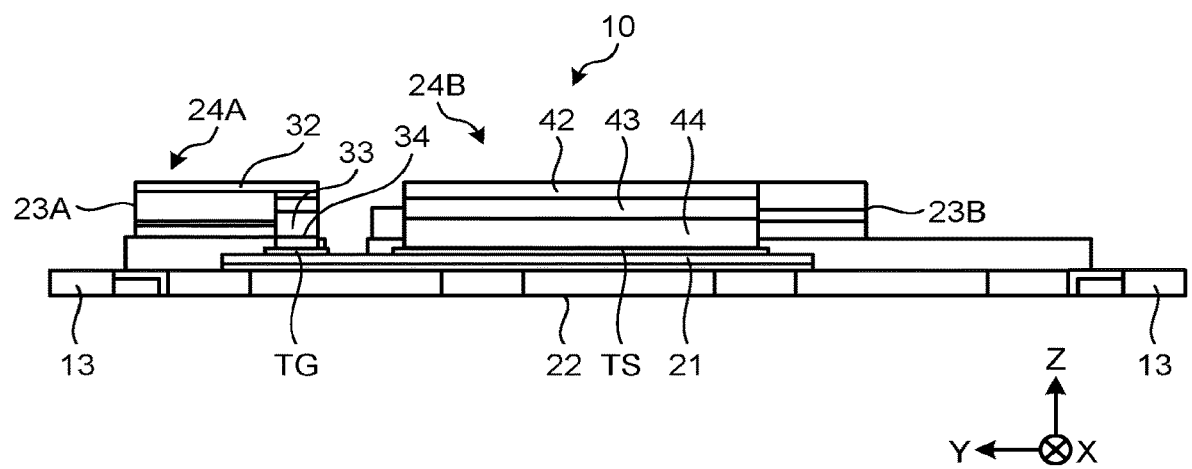
FIG. 5 is a bottom view of the semiconductor device of the embodiment before molding.

FIG. 5 is a bottom view of the semiconductor device of the embodiment before molding, that is, a left end view of the semiconductor device 10 based on FIG. 4. As illustrated in FIGS. 4 and 5, the metal connector 24A includes a connection portion 31, an extension portion 32, an arm portion 33, and a connection portion 34, which are disposed in the −X direction toward a position where the gate terminal TG of the semiconductor chip 21 is provided. The metal connector 24A has an L-shape.

The connection portion 31 has a rectangular shape, and includes a first connection face 31A provided on the rear side thereof (−Z direction). The extension portion 32 extends from the connection portion 31 in the −Y direction, and then extends in the −X direction to connect to the arm portion 33.

The arm portion 33 connects to the connection portion 34 while extending in the −X direction and the +Y direction to reach the gate terminal TG. The connection portion 34 includes a second connection face 36 on the rear side (−Z direction). The second connection face 36 is mechanically and electrically connected to the gate terminal TG.

In the above structure, the connection portion 34 of the metal connector 24A is mechanically and electrically connected to the gate terminal TG with lead solder serving as a conductive adhesive on the second connection face 34A. The connection state of the connection portion 34 will be described in detail later.

The second lead frame 23A is located, apart from the first lead frame 22, on the rear side (−Z direction) of the connection portion 31. A first connection face 31A of the connection portion 31 is mechanically and electrically connected to the second lead frame 23A with lead solder serving as a conductive adhesive. As a result, the metal connector 24A electrically connects the gate terminal TG of the semiconductor chip 21 to the second lead frame 23A through the lead solder.

The metal connector 24B, as illustrated in FIGS. 4 and 5, includes a connection portion 41, an extension portion 42, an arm portion 43, and a connection portion 44, which are disposed in the −X direction toward the position where the source terminal TS of the semiconductor chip 21 is provided.

The metal connector 24B has an L-shape. The connection portion 41 includes a first connection face on the rear side (−Z direction). The extension portion 42 extends from the connection portion 41 in the +Z direction, and then extends in the −X direction to connect to the arm portion 43.

The arm portion 43 connects to the connection portion 44 while extending in the −X and +Y directions so as to reach the source terminal TS. The connection portion 44 includes a second connection face on the rear side (−Z direction). The second connection face is mechanically and electrically connected to the source terminal TS.

In the above structure, the connection portion 44 of the third lead frame 23B is mechanically and electrically connected to the source terminal TS with lead solder serving as a conductive adhesive.

The third lead frame 23B is located, apart from the first lead frame 22, on the rear side (−Z direction) of the connection portion 41. The first connection face of the connection portion 41 is mechanically and electrically connected to the third lead frame 23B with lead solder serving as a conductive adhesive.

Figure 6:
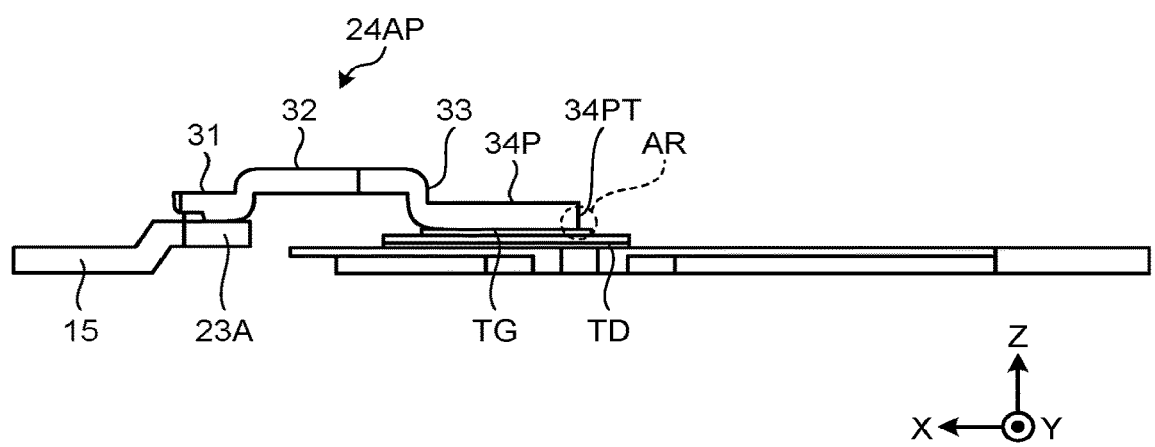
FIG. 6 is an explanatory view of a problem of a conventional semiconductor device before molding.

The following describes advantages of the embodiment. First, a conventional problem will be described. FIG. 6 is an explanatory view of the problem of a conventional semiconductor device before molding. In FIG. 6, the same signs are used for the same parts as in FIG. 5.

In a conventional metal connector 24AP, a connection portion 31, an extension portion 32, an arm portion 33, and a connection portion 34P are disposed in the −X direction toward the position where a gate terminal TG of a semiconductor chip 21 is provided. The connection portion 31 includes the first connection face on the rear side (−Z direction). The extension portion 32 extends from the connection portion 31 in the −Y direction, and then extends in the −X direction to connect to the arm portion 33.

The arm portion 33 connects to the connection portion 34 while extending in the −X direction and the +Y direction so as to reach the gate terminal TG. The connection portion 34P extends straight in the −X direction along the X-Z plane. In the connection portion 34P, a second connection face mechanically and electrically connected to the gate terminal TG is provided on the rear side (−Z direction) of the connection portion 34P.

According to the conventional structure described above, the connection portion 34P of the metal connector 24AP extends along the gate terminal TG which is disposed along the X-Z plane. The connection portion 34P is located at a position where the connection portion 34P is electrically connected to the gate terminal TG with lead solder serving as a conductive adhesive. Meanwhile, the metal connector 24AP is generally processed by punching and bending in a single process with a press machine. The most part of the connection portion 34P, especially the second connection face, is a rolled face, whereas a tip portion 34PT of the connection portion 34P is a cut face.

As a result, the tip portion 34PT of the connection portion 34P has a greater roughness than the rolled face does. Thus, not only in the tip portion 34PT, but also in the area including the vicinity of the tip portion 34PT illustrated by a circle AR in FIG. 6, the wetting of lead solder serving as a conductive adhesive is poor. Therefore, when reflow processing is performed, there is a possibility a defective joint of lead solder occurs in the area of the circle AR in FIG. 6, resulting in a defective product.

Figure 7:
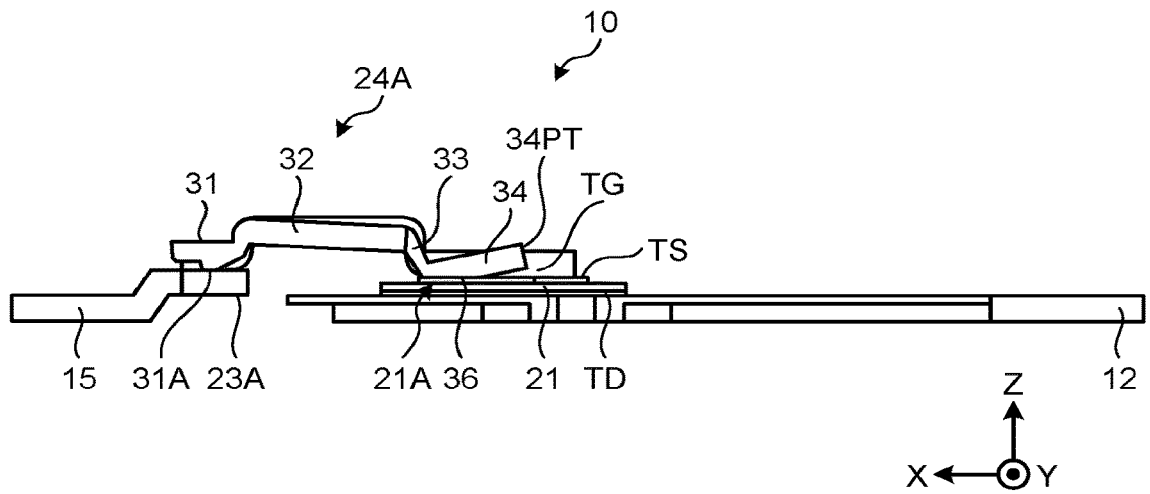
FIG. 7 is a side view of the semiconductor device of the embodiment before molding.
Figure 8:
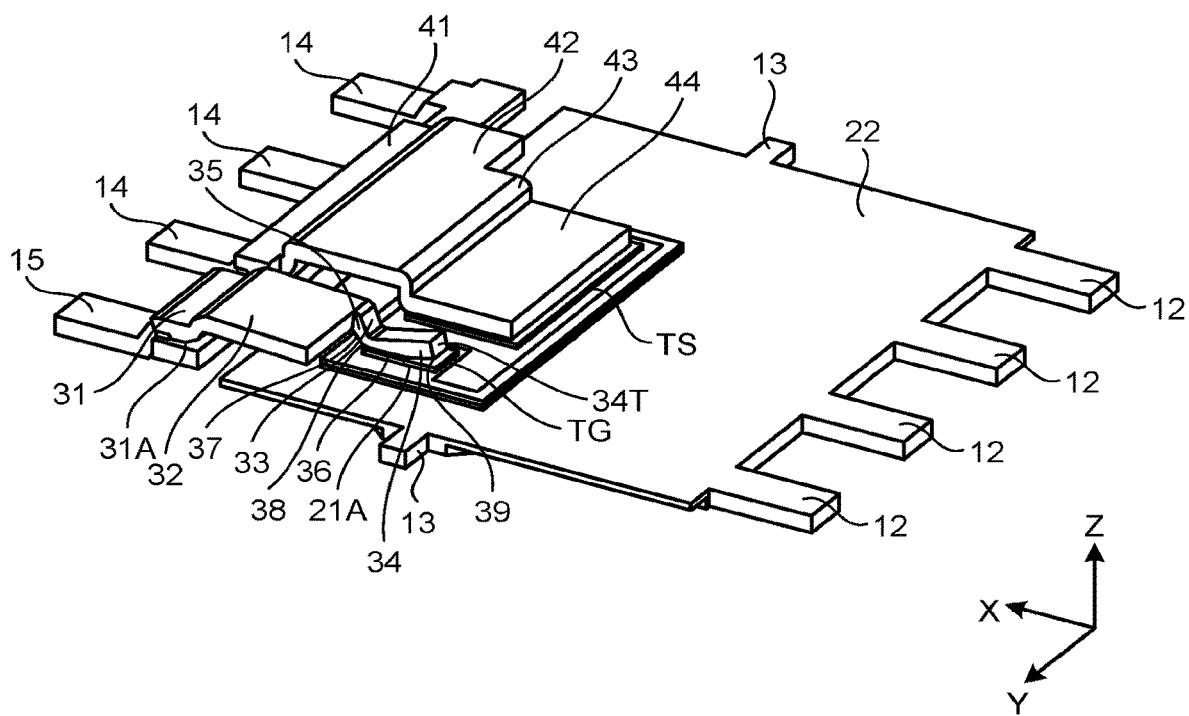
FIG. 8 is an external perspective view of the semiconductor device of the embodiment before molding.

FIG. 7 is a side view of the semiconductor device of the embodiment before molding. FIG. 8 is an external perspective view of the semiconductor device of the embodiment before molding. In the metal connector 24A of the embodiment, as illustrated in FIGS. 7 and 8, the connection portion 31, the extension portion 32, the arm portion 33, and the connection portion 34 are disposed in the −X direction toward a position where the gate terminal TG of the semiconductor chip 21 is provided.

The connection portion 31 includes the first connection face 31A on the rear side (−Z direction). The extension portion 32 extends from the connection portion 31 in the −Y direction, and then extends in the —X direction to connect to the arm portion 33.

The arm portion 33 connects to the connection portion 34 while extending in the −X direction and the +Y direction so as to reach the gate terminal TG. The connection portion 34 includes a second connection face 36 on the rear side (−Z direction). The second connection face 36 is mechanically and electrically connected to the gate terminal TG.

In the above structure, the connection portion 34 of the metal connector 24A is disposed along the gate terminal TG, that is, disposed in a state of extending in the X-axis direction. The connection portion 34 is located in a position where it is electrically connected to the gate terminal TG with lead solder serving as a conductive adhesive.

As in the conventional case described above, the metal connector 24A is generally processed by punching and bending in a single process by a press machine, and a tip portion 34T of the connection portion 34 is a cut face. However, in the connection portion 34 of the embodiment, the tip portion 34T is gradually bent in a direction separating from the gate terminal TG as an electrode to be bonded, that is, gradually bent in the +Z direction.

Figure 9:
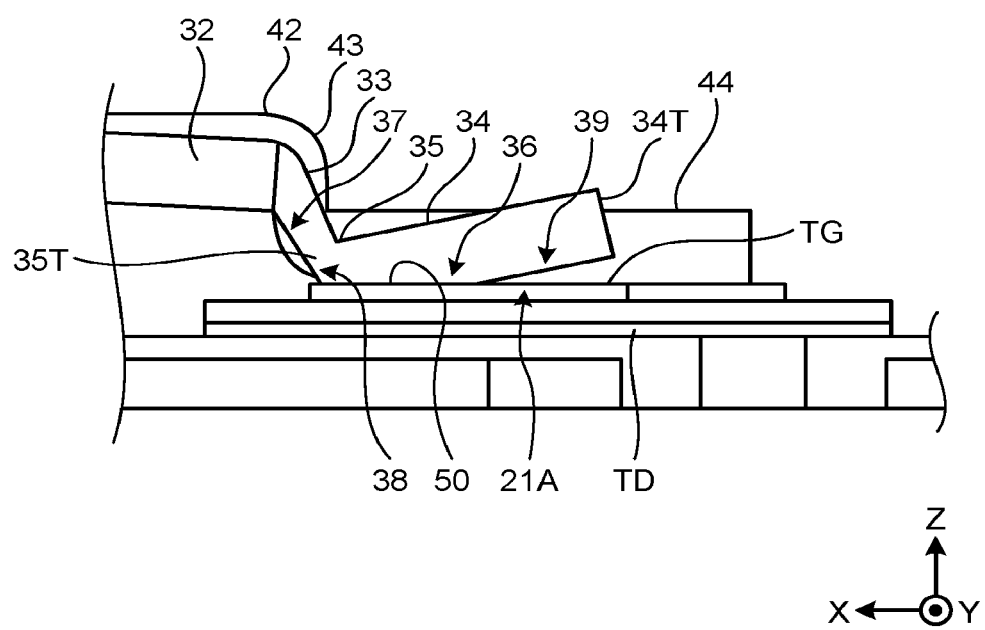
FIG. 9 is an enlarged view of a joint of a metal connector.

FIG. 9 is an enlarged view of the joint of the metal connector 24A. As illustrated in FIG. 9, the connection portion 34 is gradually bent upward (in the +Z direction) in FIG. 9 through a bending portion 35 with respect to the arm portion 33. In this structure, the tip portion 34T of the connection portion 34 is disposed apart from a bonding face 50 of the gate terminal TG, on which the connection portion 34 is connected with the lead solder as a conductive adhesive. More specifically, the connection portion 34 is gradually bent upward (in the +Z direction) such that the tip portion 34T is disposed at a position where surface tension of the lead solder does not affect the tip portion 34T, that is, a positon where the lead solder does not reach the tip portion 34T.

A lower face 37 of the arm portion 33 is a rolled face resulting from the bending process for forming the arm portion 33 and the bending portion 35.

The bending portion 35 is provided in a direction opposite to the tip portion 34T with respect to the bonding face 50. The bending portion 35 is bent in a vertical direction (+Z direction) of a formation face 21A of the semiconductor chip 21, on which the gate terminal TG is formed, such that the connection portion 34 separates from the formation face 21A.

Thus, the second connection face 36 of the connection portion 34, which is to be bonded to the bonding face 50, and a lower face 38 of the connection portion 34 are the rolled faces resulting from the bending process for forming the bending portion 35. This allows the second connection face 36 and the lower face 38 of the connection portion 34 to have a much smaller roughness than the tip portion 34T of the connection portion 34 does.

As a result, the second connection face 36 and the lower face 38 of the connection portion 34 have high wettability. Therefore, with the surface tension and capillary action of the lead solder, the second connection face 36 and the lower face 38 of the connection portion 34 are firmly bonded to the bonding face 50 of the gate terminal TG. The shapes in front view of the second connection face 36 and the bonding face 50 are each a rectangular shape in which an extending direction of the connection portion 34 is a longitudinal direction. This makes it possible, with the surface tension of lead solder, to suppress the rotation of the connection portion 34 so as to be fixed in a predetermined position even during reflow processing.

Moreover, the lower face 38 on a lower end 35T of the bending portion 35 is also a rolled face resulting from the bending process for forming the bending portion 35, and is disposed on a side within a predetermined distance (in the −X direction in FIG. 9) from the end of the gate electrode TG, so that the surface tension of the lead solder causes the lead solder to reach the surface of the gate electrode TG on the left side of the metal connector 24A in FIG. 9, and the metal connector 24A can be more firmly bonded, making it possible to improve crack resistance of the metal connector 24A.

As described above, the present embodiment makes it possible to control the behavior of the metal connector 24A during reflow processing, and to suppress the defective joint of the metal connector and the misalignment of the bonding position of the metal connector without changing a manufacturing process.

Additionally, bonding is possible with lead solder serving as a conductive adhesive entirely spreading over the second connection face 36 and the bonding face 50 of the gate terminal TG, making it possible to improve the crack resistance.

In the above description, the front view shapes of the second connection face 36 and the bonding face 50 are each a rectangular shape, but this is not limited thereto from the viewpoint of suppressing the defective joint of the metal connectors.

For example, any desired shape can be applied to the second connection face 36 and the bonding face 50, such as square, circular, oval, diamond, or the like. From the viewpoint of preventing rotation during reflow processing of metal connectors, a shape having a large aspect ratio (for example, elliptical shape, diamond shape, etc.) is desirable.

In the metal connector 24A of the above description, the bending portion 35 is provided so as to gradually bend the connection portion 34 in the vertical direction (+Z direction) apart from the formation face 21A of the gate electrode TG, and thereby the cut face (34T) is separated from the bonding face (50). In another embodiment, the metal connector (24A) may be constructed without the bending portion 35. In such a metal connector, for example, the connection portion 34 is provided to extend in a horizontal direction (−X direction along the X-Y plane in the example of FIG. 7), and the thickness of the area near the tip portion 34T is thinned by pressing so as to separate the tip portion 34T from the bonding face 50 in the +Z direction.

This structure also allows the bonding face 50 to have only the rolled face of the metal connector 24 thereon, improving the wettability of lead solder serving as a conductive adhesive.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first lead frame;
   a second lead frame located apart from the first lead frame;
   a semiconductor chip mounted on the first lead frame; and
   a conductive member electrically connecting an electrode of the semiconductor chip to the second lead frame through a conductive adhesive, wherein
   the conductive member includes:
      an extension portion extending between the first lead frame and the second lead frame,
      a connection portion including a tip portion and a connection face, the tip portion being a tip of the conductive member located at a first lead frame side, the connection face being bonded on a bonding face of the electrode through the conductive adhesive, and
      an arm portion connecting the extension portion and the connection portion,
   the connection portion is larger in length than the arm portion, the length of the arm portion being a length in a direction from the extension portion to the connection portion, the length of the connection portion being a length in a direction from the arm portion to the tip portion, and
   the tip portion of the connection portion is located apart from the bonding face of the electrode.

2. The semiconductor device according to claim 1, wherein the conductive member includes a bending portion for causing the tip portion of the connection portion to be located apart from the bonding face of the electrode.

3. The semiconductor device according to claim 2, wherein
   the bending portion is provided between the arm portion and the connection portion, and
   the bending portion is bent in a direction in which the connection portion is vertically separated from the bonding face of the electrode.

4. The semiconductor device according to claim 1, wherein the bonding face has a rectangular shape extending in an extending direction of the conductive member.

5. The semiconductor device according to claim 2, wherein
   the bending portion is bent in a direction in which the connection portion is vertically separated from the bonding face of the electrode.

6. The semiconductor device according to claim 2, wherein the bonding face has a rectangular shape extending in an extending direction of the conductive member.

7. The semiconductor device according to claim 3, wherein the bonding face has a rectangular shape extending in an extending direction of the conductive member.

8. The semiconductor device according to claim 2, wherein the bending portion is provided between the arm portion and the connection portion.

9. The semiconductor device according to claim 5, wherein the bonding face has a rectangular shape extending in an extending direction of the conductive member.

10. The semiconductor device according to claim 1, wherein the extension portion is tilted to lower from the second lead frame toward the first lead frame.

* * * * *